(12) United States Patent
Wan et al.

(10) Patent No.: US 11,851,769 B2
(45) Date of Patent: Dec. 26, 2023

(54) SEGMENTED ENVIRONMENTAL BARRIER COATING SYSTEMS AND METHODS OF FORMING THE SAME

(71) Applicant: General Electric Company, Schenectady, NY (US)

(72) Inventors: Julin Wan, Rexford, NY (US); Larry Steven Rosenzweig, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 414 days.

(21) Appl. No.: 16/994,810

(22) Filed: Aug. 17, 2020

(65) Prior Publication Data

US 2020/0378010 A1    Dec. 3, 2020

Related U.S. Application Data

(62) Division of application No. 15/493,798, filed on Apr. 21, 2017, now Pat. No. 10,934,626.

(51) Int. Cl.
  *C04B 41/89*      (2006.01)
  *C04B 41/00*      (2006.01)
  (Continued)

(52) U.S. Cl.
  CPC .......... *C23C 24/103* (2013.01); *C04B 41/009* (2013.01); *C04B 41/52* (2013.01);
  (Continued)

(58) Field of Classification Search
  CPC ......... C23C 24/103; C23C 14/08; C23C 4/12; C23C 4/10; C04B 41/52; C04B 41/009; C04B 41/89; F01D 5/282; F01D 5/284; F01D 5/288; F01D 9/02; C23D 5/005; Y02T 50/672; Y02T 50/6765; F05D 2300/6111; F05D 2300/514;
  (Continued)

(56) References Cited

U.S. PATENT DOCUMENTS

| 3,573,963 A | 4/1971 | Maxwell |
|---|---|---|
| 5,073,433 A | 12/1991 | Taylor |

(Continued)

FOREIGN PATENT DOCUMENTS

| CN | 103469144 A | 12/2013 |
|---|---|---|
| CN | 103483009 A | 1/2014 |

(Continued)

OTHER PUBLICATIONS

European Search Report & Opinion Corresponding to EP18167655.2 dated Sep. 7, 2018.

(Continued)

*Primary Examiner* — Francisco W Tschen
(74) *Attorney, Agent, or Firm* — Dority & Manning, P.A.

(57) ABSTRACT

Methods for preparing an environmental barrier coating and the resulting coating are provided. The methods and products include the incorporation of a continuous ceramic inner layer and a segmented ceramic outer layer on a CMC component. The segmented ceramic outer layer may be formed by thermal spray techniques. The coating is more stable at higher temperatures and provides for a longer lifetime of the coated component.

20 Claims, 4 Drawing Sheets

(51) Int. Cl.
| | |
|---|---|
| *C04B 41/52* | (2006.01) |
| *C23C 4/10* | (2016.01) |
| *C23C 4/12* | (2016.01) |
| *C23C 24/10* | (2006.01) |
| *F01D 5/28* | (2006.01) |
| *C23C 14/08* | (2006.01) |
| *C23D 5/00* | (2006.01) |

(52) U.S. Cl.
CPC ............. *C04B 41/89* (2013.01); *C23C 4/10* (2013.01); *C23C 4/12* (2013.01); *C23C 14/08* (2013.01); *C23D 5/005* (2013.01); *F01D 5/282* (2013.01); *F01D 5/284* (2013.01); *F01D 5/288* (2013.01); *F05D 2230/90* (2013.01); *F05D 2300/211* (2013.01); *F05D 2300/514* (2013.01); *F05D 2300/6033* (2013.01); *F05D 2300/611* (2013.01); *F05D 2300/6111* (2013.01); *Y02T 50/60* (2013.01)

(58) Field of Classification Search
CPC ......... F05D 2300/611; F05D 2300/211; F05D 2300/6033; F05D 2230/90
See application file for complete search history.

(56) References Cited

U.S. PATENT DOCUMENTS

| | | | |
|---|---|---|---|
| 6,444,335 | B1 | 9/2002 | Wang et al. |
| 6,699,607 | B1 | 3/2004 | Spitsberg |
| 6,740,364 | B2 | 5/2004 | Lau et al. |
| 6,787,195 | B2 | 9/2004 | Wang et al. |
| 7,005,200 | B2 | 2/2006 | Wang et al. |
| 7,138,183 | B2 | 11/2006 | Hisamatsu et al. |
| 7,150,921 | B2 | 12/2006 | Nelson et al. |
| 7,226,668 | B2 | 6/2007 | Nagaraj et al. |
| 7,232,615 | B2 | 6/2007 | Buhay et al. |
| 7,250,222 | B2 | 7/2007 | Halberstadt et al. |
| 8,273,470 | B2 | 9/2012 | Kirby et al. |
| 8,460,799 | B2 | 6/2013 | Arikawa et al. |
| 8,586,172 | B2 | 11/2013 | Rosenzweig et al. |
| 9,005,717 | B2 | 4/2015 | Kirby et al. |
| 9,133,541 | B2 | 9/2015 | Lee |
| 9,290,836 | B2 | 3/2016 | Zhang et al. |
| 9,309,772 | B2 | 4/2016 | Spoonire et al. |
| 9,556,505 | B2 | 1/2017 | Rosenzweig et al. |
| 9,816,392 | B2 | 11/2017 | Parakala et al. |
| 9,869,188 | B2 | 1/2018 | Brosnan et al. |
| 10,508,059 | B2 | 12/2019 | Kirby |
| 10,934,626 | B2 | 3/2021 | Wan et al. |
| 2002/0110698 | A1 | 8/2002 | Singh |
| 2003/0003328 | A1 | 1/2003 | Spitsberg et al. |
| 2003/0224124 | A1 | 12/2003 | Lau et al. |
| 2006/0014029 | A1 | 1/2006 | Saak et al. |
| 2006/0024528 | A1 | 2/2006 | Strangman et al. |
| 2006/0165893 | A1 | 7/2006 | Nagaraj et al. |
| 2009/0280298 | A1* | 11/2009 | Rosenzweig ........... C23C 30/00 428/156 |
| 2009/0311508 | A1 | 12/2009 | Stamm |
| 2010/0129636 | A1* | 5/2010 | Cybulsky ................ C23C 30/00 427/447 |
| 2013/0122259 | A1 | 5/2013 | Lee |
| 2013/0330538 | A1 | 12/2013 | Casu et al. |
| 2014/0065361 | A1 | 3/2014 | Rosenzweig et al. |
| 2014/0272169 | A1 | 9/2014 | Lee |
| 2014/0272197 | A1 | 9/2014 | Lee |
| 2015/0159507 | A1 | 6/2015 | Sivaramakrishnan et al. |
| 2015/0354392 | A1 | 12/2015 | Lipkin et al. |
| 2016/0265367 | A1 | 9/2016 | Rosenzweig et al. |
| 2016/0305319 | A1 | 10/2016 | Baldiga et al. |

FOREIGN PATENT DOCUMENTS

| | | |
|---|---|---|
| EP | 3037394 A1 | 6/2016 |
| JP | H08217576 A | 8/1996 |
| JP | 2005179696 A | 7/2005 |
| JP | 2006193828 A | 7/2006 |
| JP | 2013/194617 A | 9/2013 |
| JP | 2016/137708 A | 8/2016 |
| JP | 2017/502194 A | 1/2017 |

OTHER PUBLICATIONS

Translated Japanese Office Action Corresponding to JP2018079518 dated Jul. 19, 2019.
Harder et al., Residual Stress Analysis of Multilayer Environmental Barrier Coatings, Journal of the American Ceramic Society, vol. 92, Issue 2, Feb. 2009, pp. 452-459.
Lee et al., Rare Earth Silicate Environmental Barrier Coatings for SiC/SiC Composites and Si3N4 Ceramics, Journal of the European Ceramic Society, vol. 25, Issue 10, 2005, pp. 1705-1715.

* cited by examiner

SEGMENTED ENVIRONMENTAL BARRIER COATING SYSTEMS AND METHODS OF FORMING THE SAME

PRIORITY INFORMATION

The present application claims priority to, and is a divisional application of, U.S. patent application Ser. No. 15/493,798 filed on Mar. 21, 2017, which is incorporated by reference herein.

FIELD OF TECHNOLOGY

Environmental barrier coatings are generally provided, along with methods of their formation. In particular, environmental barrier coatings for use on ceramic matrix composites are provided, which are particularly useful as components within gas turbine engines.

BACKGROUND

The design of modern gas turbine engines is driven by the demand for higher turbine efficiency. Ceramic matrix composites ("CMCs") are an attractive material for turbine applications, as CMCs have high temperature capability and are light weight. CMC components are often protected with an environmental barrier coating ("EBC") in turbine engine environments to avoid oxidation and recession in the presence of high temperature air flow.

However, thick, continuous EBCs, for example EBCs with a thick solid abradable layer, tend to accumulate substantial thermal stress, in transient or under a thermal gradient. For instance, during operation of a gas turbine engine, the high operating temperatures increase the stress on the components of the engine. Such high thermal stress can lead to cracking and delamination of the EBC. As the component cools, the material relaxes, creating cracks in the coating. The cracking and delamination of the EBC exposes the underlying CMC component and, thus, eliminates any benefit obtained from the EBC.

Thus, an improved design of an EBC coated CMC component, particularly a component for gas turbine engines, is desirable in the art.

BRIEF DESCRIPTION

Aspects and advantages of the invention will be set forth in part in the following description, or may be obvious from the description, or may be learned through practice of the invention.

Coated components are generally provided, along with their methods of formation. In one embodiment, the coated component includes: a substrate defining a surface and comprising a ceramic composite, an inner layer defining a surface and disposed along the surface of the substrate, and an outer layer disposed along the surface of the inner layer. The inner layer may be a ceramic material, and may have a porosity of less than about 40% by volume, and may be continuous along the outer layer. The outer layer may include a plurality of growth domains defined between domain boundaries, the plurality of growth domains comprising a comparatively high density of a coating material and the domain boundaries comprising a comparatively low density of the coating material; the growth domains having a plurality of at least partially melted and solidified particles.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended FIGS., in which.

Figure 1A:
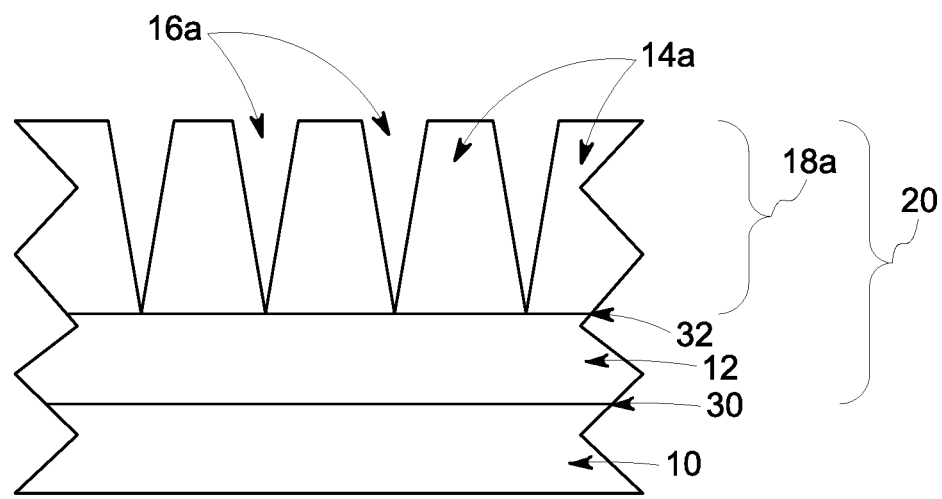
FIG. 1A is a cross-section of an exemplary coating at room temperature in accordance with one embodiment of the present disclosure.

Repeat use of reference characters in the present specification and drawings is intended to represent the same or analogous features or elements of the present invention.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers, unless expressly stated to the contrary. Thus, these terms are simply describing the relative position of the layers to each other and do not necessarily mean "on top of" since the relative position above or below depends upon the orientation of the device to the viewer.

Chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth.

As used herein, "substantially" refers to at least about 90% or more of the described group. For instance, as used herein, "substantially all" indicates that at least about 90% or more of the respective group have the applicable trait and "substantially no" or "substantially none" indicates that at least about 90% or more of the respective group do not have the applicable trait.

A coating, particularly an environmental barrier coating, is generally provided herein, along with methods of forming such coating. The coating reduces the high thermal stress present in prior environmental barrier coatings while also maintaining a continuous and, in some embodiments, hermetic seal layer protecting the underlying component from the external environment. The coating may have an increased lifetime compared to prior environmental barrier coatings and thus, may provide an increased lifetime for the underlying component, particularly for CMC components.

Generally, the coating includes a continuous inner layer(s) and a discontinuous outer layer(s). One or more inner layers of the coating are made continuous and, in some embodiments, hermetic. Generally, one or more outer layers, of which hermeticity is not required, are intentionally segmented. When a temperature gradient is applied to the system, the differential expansion across the thickness will not cause a compressive stress at the outer layer. Thus, no creep relaxation is expected at high temperature, and upon cooling, there is no tensile stress to open random and uncontrolled vertical cracks. In this way, sustained peak low cycle fatigue (SPLCF) type failure can be mitigated. In another case, when a down shock occurs, due to the multitude of preexisting boundaries, the stress intensity at the root of the boundaries may be minimized. Thus, the probability of deep-diving cracks can be reduced.

In embodiments where the coating is applied to a stator, the coating may improve the blade rub as the coating will generally not cut into the blade material. In addition, the outer, segmented layer can be prepared with a material with a higher resistance to water as the coefficient of thermal expansion will not necessarily need to match that of the CMC substrate. The coating is thereby more flexible in its design than prior EBCs.

Figure 1B:
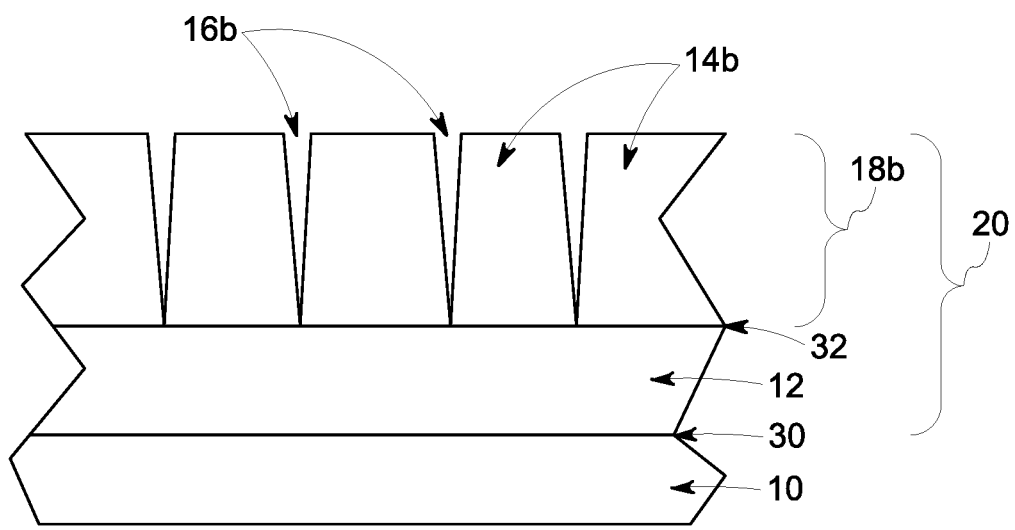
FIG. 1B is a cross-section of the exemplary coating of FIG. 1A in a high temperature environment in accordance with one embodiment of the present disclosure.

Referring now to the drawings, FIG. 1A is a cross-section of an exemplary coating 20 at room temperature in accordance with one embodiment of the present disclosure, and FIG. 1B is a cross-section of the coating of FIG. 1A in a high temperature environment, such as that of a gas turbine engine during operation. As shown in FIGS. 1A and 1B, a coating 20 is on the surface 30 of the substrate 10, with the coating 20 including an inner layer 12 and outer layer 18a, 18b, respectively. As shown, the inner layer 12 is directly on the surface 30 of the substrate 10, and the inner layer 12 defines a surface 32. In the embodiment of FIGS. 1A and 1B, the inner layer 12 is generally continuous along the surface 30 of the substrate 10 in at least the depicted portion of the illustrated component and is generally continuous beneath the outer layer 18a, 18b. As discussed in greater detail below, the inner layer 12 may be a dense ceramic layer that provides a hermetic seal protecting the underlying substrate, while the outer layer 18 is a segmented layer of growth domains 14a, 14b and domain boundaries 16a, 16b.

The inner layer 12 is generally continuous and, in some embodiments, may be hermetic. For instance, the inner layer 12 may be generally continuous with a porosity of less than about 40% by volume (e.g., 0% to about 40% by volume), such as less than about 30% by volume (e.g., 0% to about 30% by volume), less than about 20% by volume (e.g., 0% to about 20% by volume), less than about 10% by volume (e.g., 0% to about 10% by volume), less than about 5% by volume (e.g., 0% to about 5% by volume), or less than about 1% by volume (e.g., 0% to about 1% by volume). In the latter cases, the inner layer 12 may be considered dense and hermetic. As shown in FIGS. 1A and 1B, the inner layer 12 has a substantially uniform thickness along the substrate 10 and is not segmented. The inner layer 12 may have a thickness of about 25 µm to about 500 µm, such as about 50 cm to about 250 µm thick.

The inner layer 12 comprises, in one embodiment, ceramic materials, such as a rare earth silicate, alkaline earth aluminosilicate, aluminosilicate, and combinations thereof. For instance, the inner layer 12 may comprise one or more layers, such as a plurality of layers, comprising ceramic materials such as rare earth silicate coatings (e.g., rare earth monosilicate or rare earth disilicates such as slurry or APS-deposited yttrium ytterbium disilicate (YbYDS)), alkaline earth aluminosilicates (e.g., comprising barium-strontium-aluminum silicate (BSAS), such as having a range of BaO, SrO, $Al_2O_3$, and/or $SiO_2$ compositions), and combinations thereof. One or more layers may be doped as desired. In some embodiments, a BSAS layer may not be needed due to the structure of the coating 20.

The inner layer 12 may be formed by any suitable method such as air plasma spray (APS), electron beam physical vapor deposition (EBPVD), high velocity oxygen fuel (HVOF), electrostatic spray-assisted vapor deposition (ES-AVD), direct vapor deposition, electrophoretic deposition, slurry dip or spray, and combinations thereof.

As depicted schematically in FIGS. 1A and 1B, the outer layer 18a, 18b comprises a plurality of elongate material growth domains 14a, 14b. As used herein, the term "elongate" refers to a structure having an aspect ratio of greater than 1. The growth domains 14a, 14b are generally vertically oriented, meaning that their longest axes are substantially normal to the surface 30 of the substrate 10. In accordance with embodiments of the present invention, as coating material is deposited to form the outer layer 18a, 18b, the coating material accumulates in growth domains 14a, 14b defined as regions of comparatively high density separated by domain boundaries 16a, 16b of comparatively low (though not necessarily zero) density. Generally, the growth boundaries 16a, 16b create a gap between neighboring growth domains 14a, 14b such that the gap can accommodate expansion and shrinkage of each individual growth domain 14a, 14b. The outer layer 18a, 18b thereby avoids high thermal stress in high temperature applications.

Boundaries 16a, 16b may, in some embodiments, extend for a length equal to at least about 50% of the coating thickness, and this length may be at least about 75% of the thickness in certain embodiments. Generally, the strain tolerance of the outer layer 18a,18b is enhanced by the presence of longer, well-defined boundaries 16a, 16b. The outer layer 18a, 18b is generally the outermost layer of the coating and is thus exposed to the external environment.

The density of material contained within growth domains 14a, 14b, also referred to herein as "intra-domain density," is at least about 75% of theoretical density. In some embodiments, this density is even higher, such as greater than about 85% and, in certain embodiments, greater than about 95% or about 100%. A high intra-domain density may provide desirable resistance to erosion and may enhance cohesive strength of the outer layer 18a,18b. The growth boundaries 16a, 16b have a lower density than that of the growth domains 14a, 14b, and may have a density of less than about 50% of theoretical density, less than about 40%, less than about 30%, less than about 20%, less than about 10%, or less than about 1%. For instance, the growth boundaries 16a, 16b may have a density greater than 0%, but less than 10% of theoretical density.

The presence of domain boundaries 16a, 16b may provide desirable compliance and strain tolerance properties for the outer layer 18a,18b. A coating with narrower domains has a greater density of domain boundaries. The width of the growth domains 14a, 14b can be in the range from about 1 micrometer (micron, μm) to about 100 μm, in some embodiments. For instance, in certain embodiments, the width of the growth domains 14a, 14b can be in the range from about 20 μm to about 90 μm, and in particular embodiments, the width is from about 30 μm to about 80 μm. The domain boundaries 16a, 16b may have a width in the range of about 0.5 μm to about 100 μm, such as about 1 μm to about 90 μm, about 10 μm to about 80 μm, or about 20 μm to about 70 μm. Domain width as used herein is measured based on the average number of boundaries respectively intercepted by lines of known length drawn along a cross section of the coating at 33% of the outer layer 18a,18b thickness and at 67% of the outer layer 18a,18b thickness; mean domain width is simply the known length divided by the number of intercepted boundaries. In certain embodiments, at least about 50% by volume of the outer layer 18a,18b contains growth domains 14a, 14b; thus it is not necessary that the outer layer 18a,18b comprise the structure described herein. In some embodiments, however, the advantages provided by this unique structure are such that substantially all of the outer layer 18a,18b comprises the described structure.

The outer layer 18a, 18b may be prepared with thermal spray techniques such that the outer, segmented layer has a plurality of at least partially melted and solidified particles and a substantially equiaxed grain morphology. Such method allows for this unique microstructure. Other techniques may also be used in conjunction with any of the above, such as laser scribing, stamping, templated coating, masked coating, and combinations thereof.

In one particular embodiment, the outer layer 18a, 18b is generally prepared by thermal spray techniques. For example, a suspension comprising the coating material suspended in a liquid medium is sprayed at the substrate at an angle of about 90° or less to a tangent of a surface 30 of the substrate 10. The coating material comprises particles, which have a particle size ranges that may vary upon the material being coating (e.g., an average particle size of about 0.1 μm to about 2 μm).

Without being bound by any particular theory, certain characteristics of growth domains 14a, 14b indicate that the deposition mechanism for the outer layer 18a,18b is substantially by accumulation of pre-condensed matter at a growth surface. In this instance "pre-condensed matter" refers to solid and/or liquid matter that impinges upon a growth surface, rather than matter that condenses at the growth surface from the vapor phase. For example, growth domains 14a, 14b comprise a plurality of at least partially melted and solidified particles (meaning the particles were at least partially liquid before impinging the surface and finally fully solidifying), which are often (though not always) discernable as "prior particles" in the microstructure of the coating 20 via microscopy techniques. In certain embodiments, at least 50% of the material present in growth domains 14a, 14b comprises at least partially melted and solidified particles. In certain embodiments, at least about 80% of the material present in growth domains 14a, 14b comprises at least partially melted and solidified particles, and in some embodiments, substantially all of the material in growth domains 14a, 14b is made of at least partially melted and solidified particles. In some embodiments, the growth boundaries 16a, 16b may comprise partially melted and solidified particles, though the density of the growth boundaries 16a, 16b in such cases will be less than that of the growth domains 14a, 14b as previously discussed.

The thermal spray outer layer 18a, 18b of the present disclosure is in contrast to "dense vertically cracked" coatings, which are characterized in part by a lamellar microstructure that includes elongate grains readily indicative of directional solidification. The elongate grains within the lamellae tend to have a preferred orientation perpendicular to the lamella boundaries, and they typically have aspect ratios greater than about 4:1 and often as high as 10:1. In contrast to dense vertically cracked coatings, the outer layer 18a, 18b of the present invention may be characterized by randomly oriented, substantially equiaxed grains contained within growth domains 14a, 14b, and by the absence of distinct lamellar features. In this context, "substantially equiaxed" means the population of grains in the outer layer 18a, 18b has a median aspect ratio of less than about 3:1. Moreover, "randomly oriented" refers to the general lack of a preferred orientation such that long axes of grains (if such a long axis is present) are not as a whole oriented with respect to a spray direction or solidification direction. Further, in some embodiments, the outer layer 18a, 18b may be generally characterized by the absence of distinct lamellar features. Note that this use of the term "orientation" referring to the placement of a grain in space should not be confused with crystallographic orientation, or "texture" of a material.

For example, in one particular embodiment, the structure of the outer layer 18a, 18b is substantially crack free. For the silicate compositions, the structures are generally multi-phase and show up as randomly stacked lamellae within the growth domains. The individual laminate layers are generally oriented perpendicular to the spray direction. Also, for the silicates compositions, the individual laminate layers are deposited in an amorphous state from rapidly quenching molten particles and are post processed with a controlled heat treatment to form a polycrystalline coating.

The advantages described herein may enhance the suitability of the coating 20 for use in elevated temperature applications. In some embodiments, unlike conventional EBCs deposited on smooth surfaces, the coating 20 may have minimal or no segmentation cracks within the coating, a condition referred to herein as "substantially crack-free." Segmentation cracks, also known in the industry as vertical cracks, are typically more prevalent within dense coatings. These types of cracks may extend from the outermost surface through the entire thickness or partially through the coating thickness. Such cracks are distinguishable from domain boundaries in that the space within a crack is bound by a fracture surface, and is essentially void of coating particles along its length. In contrast, the space within a domain boundary contains at least some deposited material, such as coating particles, along its length. The coating 20, particularly the outer layer 18a, 18b may thereby be considered substantially crack free.

The outer layer 18a, 18b may comprise ceramic materials such as zirconates (e.g., zirconia), alumina, rare earth silicate (e.g., rare earth monosilicates), rare earth oxides, alkaline earth aluminosilicate, hafnates, niobates, tantalates, and combinations thereof. For instance, the coating material may comprise yttrium monosilicate (YMS). The outer layer 18a, 18b may comprise high temperature ceramics. The need to match the coefficient of thermal expansion to that of the other components of the coating and substrate is no longer required due to the structure of the first 18a, 18b, particularly the growth domains 14a, 14b and growth boundaries 16a, 16b. The outer layer 18a, 18b can thereby be prepared using materials with other benefits, such as higher resistance to water, than previously used in EBC coatings without having to match the coefficient of thermal expansion of the substrate. For instance, YMS has a high resistance to water vapor volatilization, but was previously not used heavily in EBCs due to its high coefficient of thermal expansion.

As shown in FIGS. 1A and 1B, as the coating is heated, such as during operation of the component or gas turbine engine, the growth domains 14a, 14b may expand. However, since the outer layer 18a, 18b has domain boundaries 16a, 16b comprising less coating material than that of the growth domains 14a, 14b, the material of the growth domains 14a, 14b is able to expand into the domain boundaries 16a, 16b without creating a compressive stress at the outer surface, thus no creep relaxation is expected at high temperature. Upon cooling, no tensile stress opens random and uncontrolled vertical cracks. In this way, sustained peak low cycle fatigue (SPLCF) type failure can be mitigated. In some embodiments, when a down shock occurs, due to the multitude of preexisting domain boundaries 16a, 16b, the stress intensity at the root of the domain boundaries 16a, 16b is minimized thus the probability of deep-diving cracks can be reduced.

The coating 20 may be formed along a portion of the surface 30 of the substrate 10, and in some embodiments, the coating 20 may be formed along the portion of the surface 30 of the substrate 10 that is configured to be exposed to high temperatures during operation of the component. One or more portions of the surface 30 of the substrate 10 may be coated with the coating 20.

The substrate 10 may comprise any suitable ceramic composite, particularly ceramic matrix composites ("CMC"). For instance, the substrate 10 may comprise a silicon-containing, or oxide containing matrix and reinforcing materials. Some examples of CMCs acceptable for use herein can include, but are not limited to, materials having a matrix and reinforcing fibers comprising non-oxide silicon-based materials such as silicon carbide, silicon nitride, silicon oxycarbides, silicon oxynitrides, silicides and mixtures thereof. Examples include, but are not limited to, CMCs with a silicon carbide matrix and silicon carbide fiber; silicon nitride matrix and silicon carbide fiber; and silicon carbide/silicon nitride matrix mixture and silicon carbide fiber. Furthermore, CMCs can have a matrix and reinforcing fibers comprised of oxide ceramics. Specifically, the oxide-oxide CMCs may be comprised of a matrix and reinforcing fibers comprising oxide-based materials such as aluminum oxide ($Al_2O_3$), silicon dioxide ($SiO_2$), yttrium aluminum garnet (YAG), aluminosilicates, and mixtures thereof. Aluminosilicates can include crystalline materials such as mullite ($3Al_2O_3 \cdot 2SiO_2$), as well as glassy aluminosilicates. Other ceramic composite materials that are not comprised of either silicon or oxygen may be used, including zirconium carbide, hafnium carbide, or other ceramic materials, alone or in combination with the materials noted above.

Figure 2A:
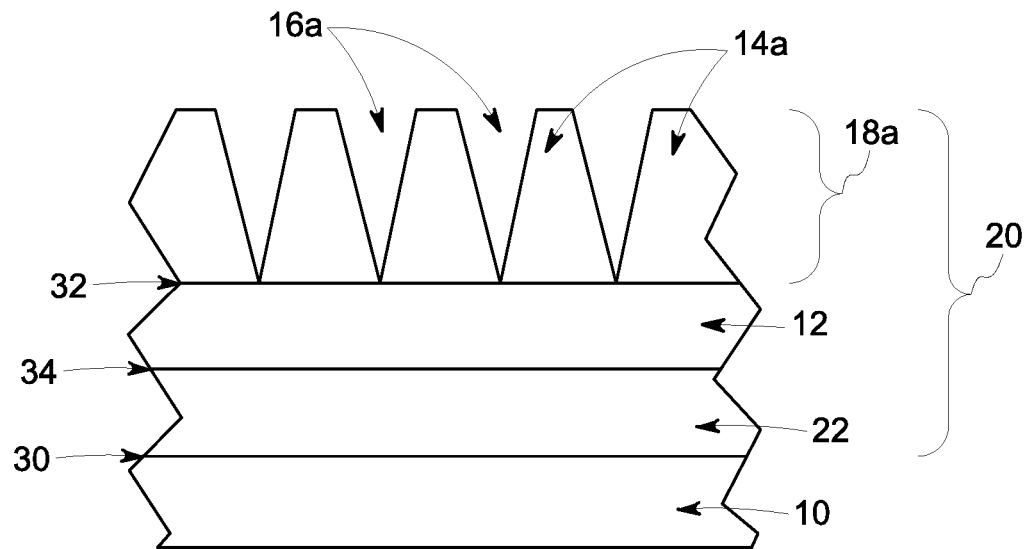
FIG. 2A is a cross-section of another exemplary coating at room temperature in accordance with one embodiment of the present disclosure.
Figure 2B:
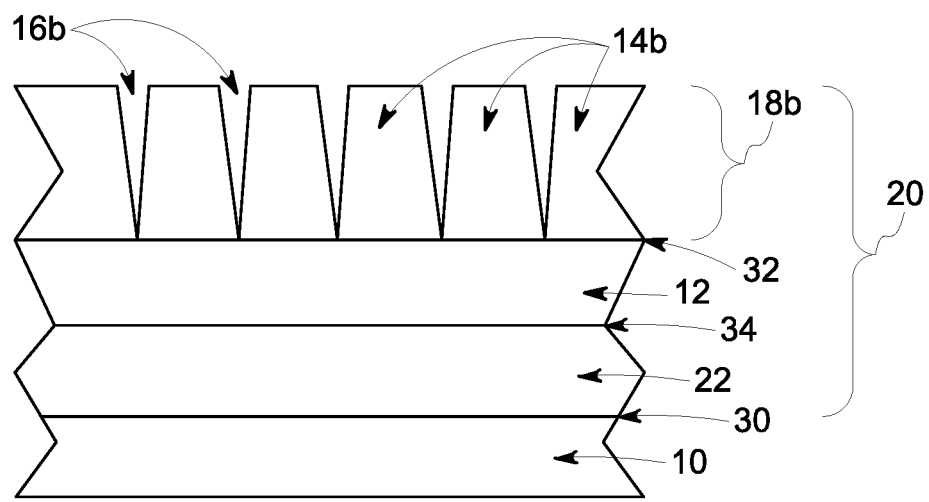
FIG. 2B is a cross-section of the exemplary coating of FIG. 2A in a high temperature environment in accordance with one embodiment of the present disclosure.

FIGS. 2A and 2B illustrate another embodiment of the present disclosure, particularly one incorporating a bond coat 22 in the coating 20. FIG. 2A is a cross-section of a coating in accordance with one embodiment of the present disclosure, and FIG. 2B is a cross-section of the coating of FIG. 2A in a high temperature environment in accordance with one embodiment of the present disclosure. FIGS. 2A and 2B include a substrate 10 coated with a coating 20 comprising a bond coat 22, an outer layer 18a, 18b and an inner layer 12. The substrate 10 has a surface 30, the bond coat 22 has a surface 34, and the inner layer 12 has a surface 32. As shown in FIGS. 2A and 2B, the inner layer 12 is generally continuous along the surface 30 of the substrate 10 in at least the depicted portion of the illustrated component and is generally continuous beneath the outer layer 18a, 18b.

The bond coat 22 is generally silicon, silicide, or a combination thereof, and can be formed on the substrate 10 by any suitable method. Without intending to be bound by theory, the bond coat 22 may enhance adhesion of ceramic topcoats. In particular, the bond coat 22 improves adhesion of the inner layer 12 and outer layer 18a, 18b to the substrate 10.

The substrate 10, inner layer 12, outer layer 18a, 18b including the growth domains 14a, 14b and the domain boundaries 16a, 16b, as well as other components used in the embodiment illustrated in FIGS. 2A-2B, may be any of those materials described herein (for example, with relation to FIGS. 1A-1B) with the accompanying characteristics.

Similar to FIGS. 1A and 1B, as the coating 20 of FIGS. 2A and 2B is heated, such as during operation of the component or gas turbine engine, the growth domains 14a, 14b expand. However, since the outer layer 18a, 18b has domain boundaries 16a, 16b comprising less coating material than that of the growth domains 14a, 14b, the material of the growth domains 14a, 14b is able to expand into the domain boundaries 16a, 16b without creating a compressive stress at the outer surface, thus no creep relaxation is expected at high temperature. Upon cooling, no tensile stress opens random and uncontrolled vertical cracks. In this way, sustained peak low cycle fatigue (SPLCF) type failure can be mitigated. In some embodiments, when a down shock occurs, due to the multitude of preexisting domain boundaries 16a, 16b, the stress intensity at the root of the domain boundaries 16a, 16b is minimized thus the probability of deep-diving cracks can be reduced.

Further embodiments of the present invention include articles comprising the coating 20 described above. The advantages described above for coating 20 makes it suitable for use in elevated temperature applications. Accordingly, in some embodiments, the article may be a component of a gas turbine assembly, including, for instance, a gas turbine assembly for power generation or for propulsion of a ship, aircraft, or other craft. Exemplary components include turbine blades, stator vanes, and combustion components.

Coatings of the present invention owe their remarkable structures and properties at least in part to the processing used in their fabrication. The process may involve air plasma spraying, which provides certain economic and manufacturing advantages over processes that require the use of vacuum equipment, such as PVD or vacuum plasma spray deposition. In particular, the process uses a feedstock comprising fine particles suspended in a liquid agent that is fed to a plasma spray torch in a controlled manner and injected into the plasma plume for deposition onto a substrate.

Those skilled in the art will appreciate that many different processing parameters are available for adjustment in a given air plasma spray process, and that various combinations of these parameters may result in coatings with different structures and properties.

The present method can be used to prepare a variety of components comprising ceramic matrix composites. For instance, the present method may be used to prepare components in the aviation industry. The present method may be used to prepare components for gas turbine engines, such as in high pressure compressors (HPC), fans, boosters, high pressure turbines (HPT), and low pressure turbines (LPT) of both airborne and land-based gas turbine engines. For instance, the present method may be used to prepare components for a turbofan engine or turbomachinery in general, including turbojet, turboprop and turboshaft gas turbine engines, including industrial and marine gas turbine engines and auxiliary power units. For instance, components such as combustion liners, shrouds, nozzles, blades, etc. may be prepared with the present method and materials. While the present disclosure may be focused on coatings for CMC turbine components, the coating may provide protection for various sections of a gas turbine engine as well as components unrelated to a gas turbine engine.

Figure 3:
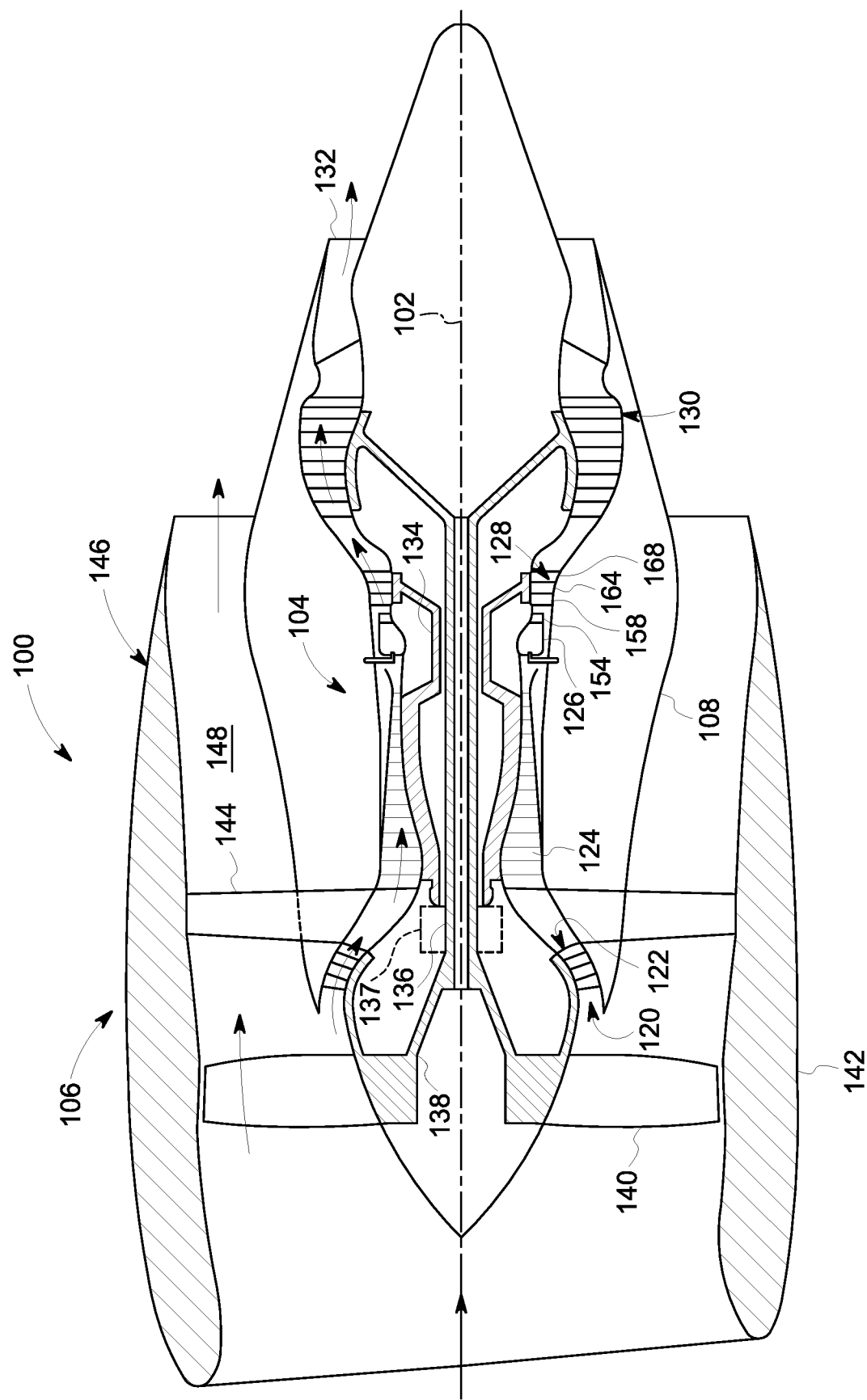
FIG. 3 is a cross-section of an exemplary gas turbine assembly in accordance with one embodiment of the present disclosure.

FIG. 3 is a schematic cross-sectional view of a gas turbine engine in accordance with one embodiment of the present disclosure. Although further described below generally with reference to a turbofan engine 100, the present disclosure is also applicable to turbomachinery in general, including turbojet, turboprop and turboshaft gas turbine engines, including industrial and marine gas turbine engines and auxiliary power units.

As shown in FIG. 3, the turbofan 100 has a longitudinal or axial centerline axis 102 that extends therethrough for reference purposes. In general, the turbofan 100 may include a core turbine or gas turbine engine 104 disposed downstream from a fan section 106.

The gas turbine engine 104 may generally include a substantially tubular outer casing 108 that defines an annular inlet 120. The outer casing 108 may be formed from multiple casings. The outer casing 108 encases, in serial flow relationship, a compressor section having a booster or low pressure (LP) compressor 122, a high pressure (HP) compressor 124, a combustion section 126, a turbine section including a high pressure (HP) turbine 128, a low pressure (LP) turbine 130, and a jet exhaust nozzle section 132. A high pressure (HP) shaft or spool 134 drivingly connects the HP turbine 128 to the HP compressor 124. A low pressure (LP) shaft or spool 136 drivingly connects the LP turbine 130 to the LP compressor 122. The LP spool 136 may also be connected to a fan spool or shaft 138 of the fan section 106. In particular embodiments, the LP spool 136 may be connected directly to the fan spool 138 such as in a direct-drive configuration. In alternative configurations, the LP spool 136 may be connected to the fan spool 138 via a speed reduction device 137 such as a reduction gear gearbox in an indirect-drive or geared-drive configuration. Such speed reduction devices may be included between any suitable shafts/spools within engine 100 as desired or required.

As shown in FIG. 3, the fan section 106 includes a plurality of fan blades 140 that are coupled to and that extend radially outwardly from the fan spool 138. An annular fan casing or nacelle 142 circumferentially surrounds the fan section 106 and/or at least a portion of the gas turbine engine 104. It should be appreciated by those of ordinary skill in the art that the nacelle 142 may be configured to be supported relative to the gas turbine engine 104 by a plurality of circumferentially-spaced outlet guide vanes 144. Moreover, a downstream section 146 of the nacelle 142 (downstream of the guide vanes 144) may extend over an outer portion of the gas turbine engine 104 so as to define a bypass airflow passage 148 there between.

The HP turbine 128 includes, in serial flow relationship, a first stage of stator vanes 154 (only one shown) axially spaced from turbine rotor blades 158 (only one shown) (also referred to as "turbine blades") and a second stage of stator vanes 164 (only one shown) axially spaced from turbine rotor blades 168 (only one shown) (also referred to as "turbine blades").

Figure 4:
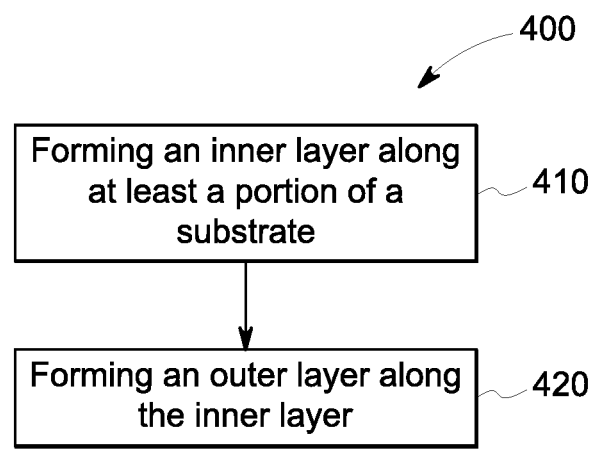
FIG. 4 is a flowchart of an exemplary method of forming a coating in accordance with one embodiment of the present disclosure.

FIG. 4 is a flowchart of a method of forming a coating in accordance with one embodiment of the present disclosure.

In particular, FIG. 4 illustrates a method of coating a CMC component. The method 400 includes forming an inner layer along at least a portion of a substrate 410 and forming an outer layer having a first surface and a second surface along the inner layer 420. The inner layer may be formed by any suitable method such as air plasma spray (APS), electron beam physical vapor deposition (EBPVD), high velocity oxygen fuel (HVOF), electrostatic spray-assisted vapor deposition (ESAVD), direct vapor deposition, and combinations thereof. In certain embodiments, the outer layer may be prepared with thermal spray techniques such that the outer, segmented layer has a plurality of at least partially melted and solidified particles and a substantially equiaxed grain morphology. Other techniques may also be used in conjunction with any of the above, such as laser scribing, stamping, templated coating, masked coating, and combinations thereof. In some embodiments, the method 400 further includes forming a bond coat along at least a portion of the substrate prior to forming the inner layer.

While the invention has been described in terms of one or more particular embodiments, it is apparent that other forms could be adopted by one skilled in the art. It is to be understood that the use of "comprising" in conjunction with the coating compositions described herein specifically discloses and includes the embodiments wherein the coating compositions "consist essentially of" the named components (i.e., contain the named components and no other components that significantly adversely affect the basic and novel features disclosed), and embodiments wherein the coating compositions "consist of" the named components (i.e., contain only the named components except for contaminants which are naturally and inevitably present in each of the named components).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of forming a coated CMC component comprising:
   forming an inner layer along at least a portion of a substrate, and
   forming an outer layer along the inner layer by depositing a plurality of pre-condensed matter particles of a coating material that have been at least partially melted before impinging a surface and solidified thereon,
   wherein the substrate comprises a ceramic composite,
   wherein the inner layer comprises ceramic material, has a porosity of less than about 40% by volume, and is continuous along the outer layer, and
   wherein the outer layer comprises a plurality of growth domains defined between domain boundaries, the plurality of growth domains comprising a comparatively high density of the coating material and the domain boundaries comprising a comparatively low density of the coating material, the domain boundaries defining respective gaps between the growth domains that are configured to accommodate expansion and shrinkage of the growth domains into the gaps.

2. The method of claim 1, wherein the domain boundaries comprise a density of the coating material greater than 0%.

3. The method of claim 1, wherein each growth domain has a width in a range from about 1 µm to about 100 µm.

4. The method of claim 1, wherein each growth domain has a width in a range from about 20 µm to about 90 µm.

5. The method of claim 1, wherein less than about 50% by volume of the outer layer comprises growth domains.

6. The method of claim 1, wherein at least 50% or more by volume of the outer layer comprises the growth domains.

7. The method of claim 1, wherein the coating material is different from the ceramic material of the inner layer.

8. The method of claim 1, wherein the inner layer defines a surface, and wherein the outer layer is formed on the surface of the inner layer.

9. The method of claim 8, wherein forming the outer layer along the inner layer comprises forming the outer layer along the inner layer by thermal spray of the coating material on the surface of the inner layer.

10. The method of claim 1, wherein the domain boundaries define a smaller height of the coating material than that of the growth domain such that there is a space above the coating material in the domain boundaries.

11. The method of claim 1, wherein the outer layer consists of the coating material.

12. The method of claim 1, wherein the outer layer has an intra-domain density of at least about 75%.

13. The method of claim 12, wherein the outer layer has an intra-domain density of at least about 85%.

14. The method of claim 1, wherein the outer layer has a substantially equiaxed grain morphology.

15. The method of claim 1, wherein forming the outer layer comprises suspension plasma spraying, laser scribing, saw-cutting, stamping, template coating, masked coating, or combinations thereof.

16. The method of claim 1, wherein forming the outer layer comprises providing a suspension comprising the coating material suspended in a liquid medium, and spraying the substrate at an angle of about 90 degrees or less to a tangent of a surface of the substrate.

17. The method of claim 1, wherein the inner layer comprises one or more of a rare earth silicate, alkaline earth aluminosilicate, aluminosilicate, and combinations thereof.

18. The method of claim 1, wherein the coating material comprises one or more of a zirconia, alumina, rare earth silicate, alkaline earth aluminosilicate, and combinations thereof.

19. The method of claim 1, wherein the coating material comprises rare earth monosilicate.

20. The method of claim 1, further comprising:
   forming a bond coat defining a surface along at least a portion of the substrate, and
   wherein forming the inner layer along at least a portion of the substrate comprises forming the inner layer at least partially on the surface of the bond coat.

* * * * *